US009921486B2

(12) United States Patent
Duerig et al.

(10) Patent No.: US 9,921,486 B2
(45) Date of Patent: Mar. 20, 2018

(54) MULTISCALE PATTERNING OF A SAMPLE WITH APPARATUS HAVING BOTH THERMO-OPTICAL LITHOGRAPHY CAPABILITY AND THERMAL SCANNING PROBE LITHOGRAPHY CAPABILITY

(71) Applicant: SWISSLITHO AG, Zurich (CH)

(72) Inventors: Urs T Duerig, Rueschlikon (CH); Stefan Fringes, Zurich (CH); Felix Holzner, Langnau am Albis (CH); Armin W Knoll, Adliswil (CH)

(73) Assignee: SWISSLITHO AG, Zurich (CH)

( * ) Notice: Subject to any disclaimer, the term of this patent is extended or adjusted under 35 U.S.C. 154(b) by 0 days.

(21) Appl. No.: 15/104,596

(22) PCT Filed: Nov. 13, 2014

(86) PCT No.: PCT/IB2014/066007
§ 371 (c)(1),
(2) Date: Jun. 15, 2016

(87) PCT Pub. No.: WO2015/092570
PCT Pub. Date: Jun. 25, 2015

(65) Prior Publication Data
US 2017/0003602 A1    Jan. 5, 2017

(30) Foreign Application Priority Data
Dec. 19, 2013  (GB) .................................. 1322497.7

(51) Int. Cl.
*G03F 7/20*    (2006.01)

(52) U.S. Cl.
CPC ........ *G03F 7/70591* (2013.01); *G03F 7/7045* (2013.01); *G03F 7/70383* (2013.01); *G03F 7/70458* (2013.01)

(58) Field of Classification Search
CPC ............. G03F 7/70591; G03F 7/70383; G03F 7/7045; G03F 7/7048; G01Q 20/00;
(Continued)

(56) References Cited

U.S. PATENT DOCUMENTS

2005/0106508 A1* 5/2005 Shintani ................. G11B 7/261
430/322
2005/0235869 A1* 10/2005 Cruchon-
Dupeyrat ............... B82Y 10/00
106/31.29
(Continued)

FOREIGN PATENT DOCUMENTS

WO    2007027757 A2    3/2007
WO    2011045753 A1    4/2011

OTHER PUBLICATIONS

Kaestner, Marcus, Nanolithography by scanning probes on calixarene molecular glass resist using mix-and-match lithography, Journal OfMicro/Nanolithography Mems, and Moems, Aug. 16, 2013, pp. 031111-1-031111-13, Jul.-Sep. 2013/vol. 12(3), SPIE 2013, Germany <http://nanolithography.spiedigitallibrary.org/>.

(Continued)

*Primary Examiner* — Nicole Ippolito
(74) *Attorney, Agent, or Firm* — Browdy and Neimark, PLLC

(57) ABSTRACT

The present invention provides a method for multiscale patterning of a sample. The method includes: placing the sample in an apparatus having both thermo-optical lithography capability and thermal scanning probe lithography capability; and patterning two patterns onto the sample, respectively by: thermo-optical lithography, wherein light is emitted from a light source onto the sample to heat the latter and thereby write a first pattern that is the largest of the two patterns; and thermal scanning probe lithography, wherein the sample and a heated probe tip are brought in contact for writing a second pattern that has substantially smaller critical dimensions than the first pattern. There is also provided an apparatus for multiscale patterning of a sample.

25 Claims, 5 Drawing Sheets

(58) Field of Classification Search
CPC ........ G01Q 20/02; G01Q 30/02; G01Q 30/08; G01Q 30/10
USPC .......................................... 850/5, 6, 12, 13
See application file for complete search history.

(56) References Cited

U.S. PATENT DOCUMENTS

2006/0091322 A1   5/2006  Despont et al.
2007/0281247 A1  12/2007  Phillips et al.
2016/0231656 A1*  8/2016  Holzner ................ G03F 7/0002

OTHER PUBLICATIONS

Pires, David, Nanoscale Three-Dimensional Patterning of Molecular Resists by Scanning Probes, Science, May 7, 2010, pp. 732-735, vol. 328-Iss.5979, AAAS 2010 <http://science.sciencemag.org/content/328/5979/732.long/>.
Paul, PH, Field stitching in thermal probe lithography by means of surface roughness correlation, Nanotechnology, vol. 23—Iss. 38, 2012 IOP Publishing Ltd <http://iopscience.iop.org/article/10.1088/0957-4484/23/38/385307/meta;jsessionid=097B9F38F0B714AC73879C53056E6C7F.c1.iopscience.cld.iop.org/>.
Knoll, Armin, Probe-Based 3-D Nanolithography Using Self-Amplified Depolymerization Polymers, Advanced Materials, pp. 3361-3365, vol. 22—Iss. 31, 2010 Wiley <https://scholar.google.com/citations?view_op=view_citation&hl=en&user=Tmgd87UAAAAJ&citation_for_view=Tmgd87UAAAAJ:ufrVoPGSRksC/>.
Paul, PH, Rapid turnaround scanning probe nanolithography, Nanotechnology, vol. 22—Iss. 27, 2011 IOP Published Ltd <http://iopscience.iop.org/article/10.1088/0957-4484/22/27/275306/meta/>.

\* cited by examiner

MULTISCALE PATTERNING OF A SAMPLE WITH APPARATUS HAVING BOTH THERMO-OPTICAL LITHOGRAPHY CAPABILITY AND THERMAL SCANNING PROBE LITHOGRAPHY CAPABILITY

CROSS REFERENCE TO RELATED APPLICATION

This application claims priority under 35 U.S.C. § 371 from PCT Application PCT/IB2014/066007, filed on Nov. 13, 2014, which claims priority from UK Patent Application No. 1322497.7, filed Dec. 19, 2013. The entire contents of both applications are incorporated herein by reference.

FIELD OF THE INVENTION

The invention relates in general to the fields of thermo-optical lithography and thermal scanning probe lithography. In particular, it relates to methods and apparatuses for multiscale patterning of a sample, which combine thermo-optical lithography and thermal scanning probe lithography.

BACKGROUND OF THE INVENTION

Lithography is a process for producing patterns of two dimensional shapes, consisting of drawing primitives such as lines and pixels within a layer of material, such as, for example, a resist coated on a semiconductor device. Conventional photolithography (also called optical lithography) is running into problems as the feature size is reduced, e.g., below 45 nm. Thermo-optical lithography (or tOL) is an example of optical lithography technique, known per se. These problems arise from fundamental issues such as sources for the low wavelength of light, photoresist collapse, lens system quality for low wavelength light and masks cost. To overcome these issues, alternative approaches are required.

Examples of such alternative approaches are known in the field of the so-called nanolithography, which can be seen as high resolution patterning of surfaces. Nanolithography refers to fabrication techniques of nanometer-scale structures, including patterns having one dimension typically sizing up to about 100 nm (hence partly overlapping with photolithography). Beyond the conventional photolithography, they further include such techniques as charged-particle lithography (ion- or electron-beams), nanoimprint lithography and its variants, and scanning probe lithography (or SPL). SPL can be used for patterning at the nanometer-scale.

In general, SPL is used to denote lithographic methods where a probe tip is moved across a surface to form a pattern. Scanning probe lithography makes use of scanning probe microscopy (SPM) techniques. SPM techniques rely on scanning a probe, e.g., a sharp tip, in close proximity with a sample surface whilst controlling interactions between the probe and the surface. A confirming image of the sample surface can afterwards be obtained, typically using the same scanning probe in a raster scan of the sample. In the raster scan the probe-surface interaction is recorded as a function of position and images are produced as a two-dimensional grid of data points.

The lateral resolution achieved with SPM varies with the underlying technique: atomic resolution can be achieved in some cases. Use can be made of piezoelectric actuators to execute scanning motions with a precision and accuracy, at any desired length scale up to better than the atomic scale. The two main types of SPM are the scanning tunneling microscopy (STM) and the atomic force microscopy (AFM). In the following, acronyms STM/AFM can refer to either the microscopy technique or to the microscope itself.

In particular, the AFM is a device in which the topography of a sample is modified or sensed by a probe mounted on the end of a cantilever. As the sample is scanned, interactions between the probe and the sample surface cause pivotal deflection of the cantilever. The topography of the sample can thus be determined by detecting this deflection of the probe. Yet, by controlling the deflection of the cantilever or the physical properties of the probe, the surface topography can be modified to produce a pattern on the sample.

Following this idea, in a SPL device, a probe is raster scanned across a functional surface and brought to locally interact with the functional material. By this interaction, material on the surface is removed or changed. In this respect, one can distinguish amongst:

Constructive probe lithography, where patterning is carried out by transferring chemical species to the surface; and Destructive probe lithography, which consists of physically and/or chemically deforming a substrate's surface by providing energy (mechanical, thermal, photonic, ionic, electronic, X-ray, etc.).

Thermal scanning probe lithography (or tSPL) is an example of SPL method, also known per se. tSPL is a thermo-mechanical lithography method capable of fabricating nano-structures quickly (see Pires et al., 2010, and Paul et al., 2011, cited below). Examples of tSPL methods are described in Knoll et al., 2010 and Paul et al., 2012.

High resolution patterning of surfaces is relevant to several areas of technology, such as alternatives to optical lithography, patterning for rapid prototyping, direct functionalization of surfaces, mask production for optical and imprint lithography, and data storage.

Now, it can be realized that lithographic patterns often are composed of multiscale objects (e.g., patterns). As it can be realized too, such objects are difficult to write efficiently using direct write methods, as the latter are actually optimized for writing the smallest scale features. This issue can be addressed in electron beam lithography by beam shaping. However, beam shaping typically uses rectangular beams, which deteriorates the highest achievable resolution, for which a Gaussian beam shape is required. Correspondingly, two types of instruments are commercially available. In the context of tSPL, high resolution patterning can be achieved by using sharp probe tips. In such a context, it can be realized that the writing of extensive structures is time-consuming, as it requires repeated scanning of closely spaced lines. This problem can be alleviated by "multiplexing" the probe tips, i.e., using different probe shapes and sizes, as suggested by beam shaping in e-beam lithography. However, present inventors have realized that the patterning speed is still limited by the mechanical actuation of the probes. Furthermore, tip-wear can potentially cause additional problems if large scale patterns are to be written.

There is accordingly a need for efficient multiscale patterning methods and apparatuses.

BRIEF SUMMARY OF THE INVENTION

According to a first aspect of the present invention, a method for multiscale patterning of a sample is provided. The method includes: placing the sample in an apparatus having both thermo-optical lithography capability and thermal scanning probe lithography capability; and patterning two patterns onto the sample, respectively by: thermo-optical lithography, wherein light is emitted from a light source onto the sample to heat the latter and thereby write a first pattern that is the largest of the two patterns; and thermal scanning probe lithography, wherein the sample and a heated probe tip are brought in contact for writing a second pattern that has substantially smaller critical dimensions than the first pattern.

According to a second aspect of the present invention, an apparatus for multiscale patterning of a sample is provided. The apparatus includes: a sample holder, for placing a sample to be patterned; a patterning means, including: an optical beam lithography means controllably positionable relative to the sample, and including a light source such as a laser, wherein the optical beam lithography means is configured to direct light onto the sample; and a thermal scanning probe lithography means, including: a probe tip, the apparatus being further configured to bring the sample and the probe tip in contact; and a heater element coupled in the apparatus to controllably heat the probe tip, wherein the apparatus is adapted for patterning two patterns of substantially different critical dimensions onto the sample, respectively, via the thermo-optical lithography means and thermal scanning probe lithography means.

BRIEF DESCRIPTION OF SEVERAL VIEWS OF THE DRAWINGS

FIG. 4 schematically illustrates a step of a method according to an embodiment of the present invention;

FIG. 5 schematically illustrates a step of a method according to an embodiment of the present invention;

FIG. 6 schematically illustrates a step of a method according to an embodiment of the present invention;

FIG. 7 schematically illustrates a step of a method according to an embodiment of the present invention; and FIG. 8 schematically illustrates a step of a method according to an embodiment of the present invention.

DETAILED DESCRIPTION OF THE INVENTION

The following description is structured as follows. First, general embodiments and high-level variants are described (sect. 1). The next section addresses more specific embodiments and technical implementation details (sect. 2).

1. General Embodiments and High-Level Variants

Referring first generally to FIGS. 1-11, aspects of the invention is first described, which concerns methods and apparatuses for multiscale patterning of a sample. Basically, a core concept is to rely on a multiscale patterning apparatus 10, which combines thermo-optical lithography (hereafter "tOL"), used for the largest patterns, with thermal scanning probe lithography (hereafter "tSPL"), used for the smallest patterns. Thus, instead of multiplexing a same type of technology (e.g., using different probe shapes or beam shaping in e-beam lithography), two distinct technologies are here combined in a same apparatus. Some aspects of these two techniques can be independently optimized, in respect of the respective patterns to be obtained (instead of being optimized for writing the smallest scale features, as noted in introduction). Because tOL is used for the largest patterns, the patterning speed is much less sensitive to the mechanical actuation issues of the tSPL probes or to tip-wear, where large patterns are to be written. Still, other aspects of these two techniques and the corresponding means 20, 30 used in the apparatus 10 can be jointly optimized, e.g., to achieve registry of the two types of patterns 200, 300 or connect these patterns, as discussed below.

Figure 9:
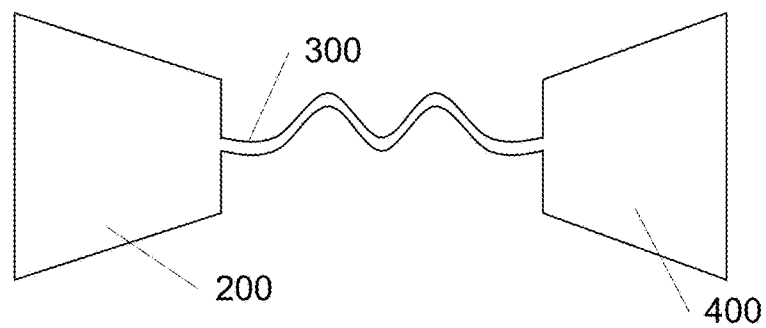
FIG. 9 schematically illustrates connected patterns as obtained according to embodiments of the invention.
Figure 10:
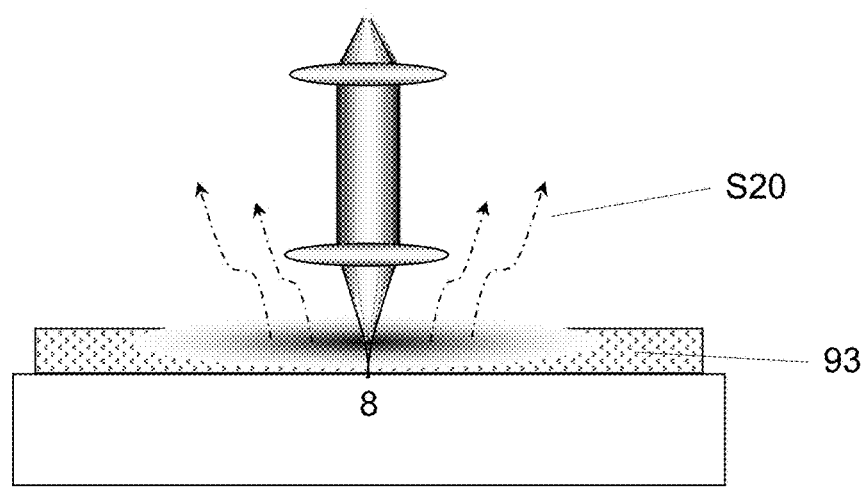
FIG. 10 schematically illustrates a thermo-optical lithography patterning of a sample that includes a polymer with a dispersion of particles embedded therein, which particles extends the optical absorption of the polymer to longer wavelengths.
Figure 11:
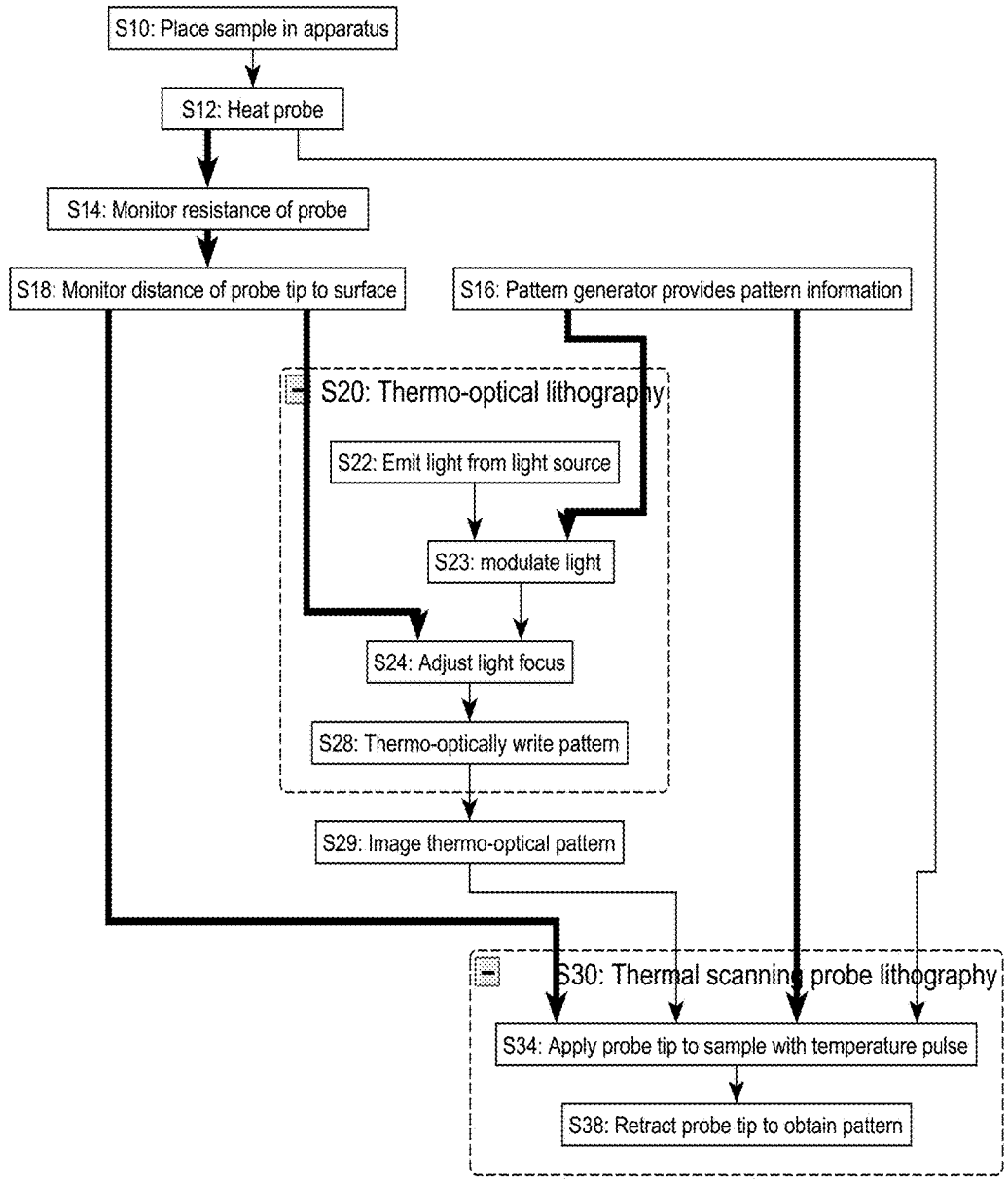
FIG. 11 is a flowchart illustrating high-level steps of a method for multiscale patterning of a sample, according to embodiments.

More formally, an initial step (S10 in FIG. 11) consists of placing the sample 9 to be patterned in the multiscale patterning apparatus 10, e.g., in a sample holder or housing. The same sample holder or housing can for instance serve for both the tOL and tSPL steps. Detailed embodiments of this apparatus will be later described in detail in reference to FIG. 1. Then, at least two patterns 200, 300 are created, which have substantially different critical dimensions, see steps S20, S30 in FIG. 11. As touched above, the patterning steps involve the distinct capabilities of the same apparatus 10. Namely:

Thermo-optical lithography 20 means of the apparatus 10 are involved to write S28 the first pattern 200, i.e., the largest of the two patterns 200, 300, see FIG. 9. To that aim, light $l_1$ is emitted S22 from a light source 2 and then directed $l_3$ onto the sample 9 to heat the latter, to thermo-optically write the pattern 200; and Thermal scanning probe lithography means 30 are involved to write S30 the second pattern 300. Here, a heated probe tip 34 and the sample 9 are brought in contact S34, as in tSPL methods, which results in writing S38 the second pattern. Examples of how to enable the tSPL are given below.

The multiscale patterning methods discussed here can otherwise be regarded as multi-resolution patterning methods where the second lithographic pattern has the highest resolution. This approach allows multiscale patterning to be efficiently handled: large patterns are performed by tOL while more subtle patterns can be accurately rendered by tSPL.

The two patterns 200, 300 have substantially different critical dimensions. The terminology "critical dimension" is well-known in lithography: it means the dimension of the smallest achievable feature. The critical dimensions of the two patterns 200, 300 obtained here typically differ by at least one order of magnitude, owing to the different techniques used (tOL vs. tSPL), the second (tSPL) pattern having the smaller critical dimensions. The critical dimensions of the two patterns 200, 300 can for instance differ by at least a factor 5 (but more likely 10, 20 or more). In practice, tSPL typically reaches 10 nm critical dimensions, while tOL patterns (e.g., Laser-obtained patterns) typically reach 200-500 nm. The largest patterns 200, 400 can typically correspond to interfaces to the outside, macroscopic world, for which the resolution is less important than for the smallest patterns 300. The largest patterns 200, 400 can for instance correspond to bonding pads, like in FIG. 9. Note, however, that overlay capability (performing several steps S20, S30 on already formed patterns) allows refining features of tOL patterns by tSPL and/or varying the depths of the patterns, in order to form be 3D objects, if desired.

Most efficiently and conveniently, a Laser source 2 can be used to emit light $l_1$. As described later in more detail, the emitted light $l_1$ can typically be modulated S23, expanded $l_2$ and then focused $l_3$ onto the sample 9, see step S24 in FIG. 11. If necessary, a beam splitter and a focusing objective can be used. Other usual means in tOL can further be involved.

Most practical is to apply S34 the probe tip 34 to and then retract S38 it from the sample 9, for writing the second pattern 300. The probe 32 carrying the probe tip 34 is typically a cantilever. However, in variants, the sample can instead be urged vertically against the probe tip, using a vertical translation stage. Still, preferred embodiments make use of a voltage bias applied between the probe and the sample to urge the probe tip against the surface and thereby write patterns onto it, as discussed in detail below.

As evoked earlier, the tOL steps can advantageously make use of the tSPL capability. In this respect (and referring now more particularly to FIGS. 1 and 11): the tOL patterning step S20 shall preferably include adjusting and/or modulating S23, S24 the light $l_1$, $l_2$, $l_3$ according to a signal acquired via the probe tip 34, be it to adjust a distance between the tOL means 20 and the sample 9. A signal acquired via the probe tip 34 makes it possible to infer the distance between the probe tip and the sample surface 95, and in turn the distance between tOL means 20 and the same sample 9, taking into account a known offset between lithographic means 20, 30 in the direction perpendicular to the surface 95 of the sample 9 to be patterned (the "vertical" offset). Several ways of monitoring the sample—probe tip distance are known. A preferred method used here is to acquire said signal by measuring S14 an electrical resistance of heating means 36b arranged at the probe 32 (which probe includes the probe tip 34, see e.g., FIGS. 1-3). This electrical resistance depends on the distance between the probe tip 34 and the sample 9. Thus, measuring S14 the electrical resistance of the heating means 36b allows, effectively, the distance between the probe tip 34 and the sample 9 (the "first distance") to be determined. It can therefore be taken advantage of the probe tip 34 of the tSPL means 30 to adjust one or more parameters of the tOL means 20. Such parameters can notably encompass physical characteristics of the light, which can be adjusted and/or modulated based on the measured resistance or correspondingly the first distance. In particular, such parameters can include one or any combination of the location of the means 20 (especially the means 1, 42 to be described later, to change the focal spot), light modulation, light intensity, etc., to optimize characteristics of the tOL patterns 200, 400.

In particular, the distance between light focusing means 1, 42 of the optical means 20 and the sample 9 can be adjusted S24 based on the measured electrical resistance or the first distance, where the light focusing means 1, 42 are adapted to focus light $l_3$ onto the sample 9. To that aim, the light focusing means 1, 42 can be mounted movable in the apparatus 10 (e.g., as telescopic means). They can for instance be translated based on information received from distance monitoring means 6, to adjust the focus of light $l_3$, step S24.

Figure 2:
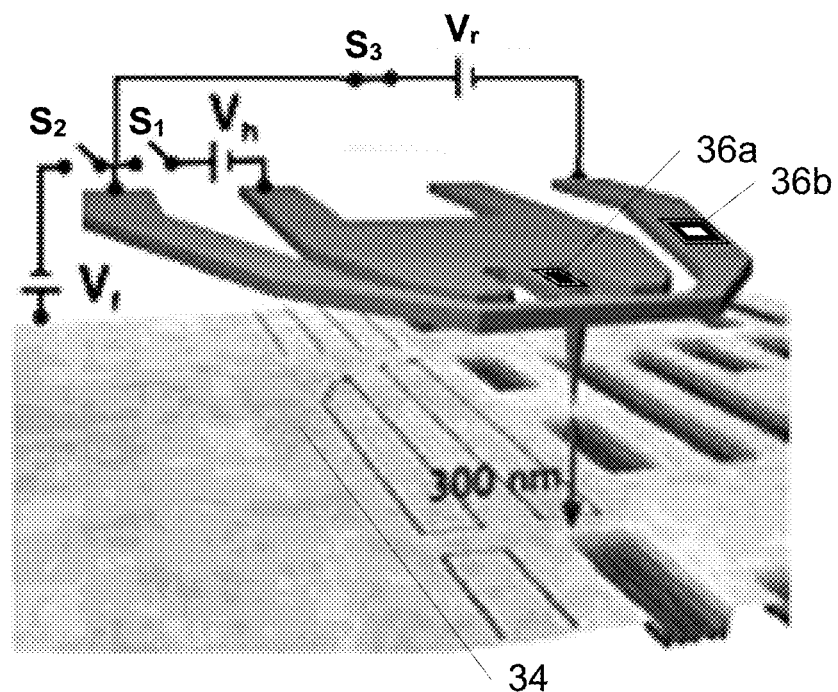
FIGS. 2 and 3 are 3D views representing a probe configured for measuring a varying resistance and thereby determining the distance to the sample surface (FIG. 2), and furthermore actuatable to create a pattern onto the sample (FIG. 3), as involved in embodiments of the invention.
Figure 3:
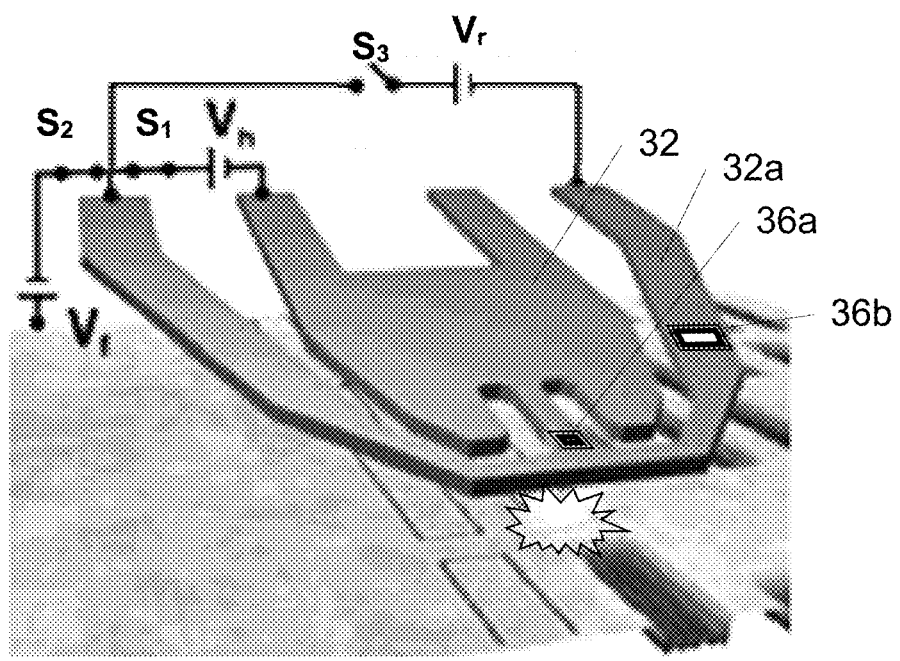

Concerning now the tSPL part: the tip 32 is preferably heated directly in situ, via a heater (i.e., thermal) element 36a located proximal to the tip 34, as seen in FIGS. 2-3. This element 36a can for instance be connected to a switch S1 and a corresponding circuitry, configured for applying temperature pulses. Other heating means 36b can be connected to a switch S3. The electrical resistance of the heating means 36b appears to change with the distance above the sample, if the heating means are suitably arranged at the probe, which provides a means to measure the height with nanometer precision. Thus heating means 36b can therefore be used to measure their varying resistance and thereby determine the distance to the sample surface 95.

Incidentally, other SPL techniques for monitoring the distance from the probe tip 34 to the surface 95 are known, which can be used in the present context too (without necessarily relying on the varying resistance).

Figure 1:
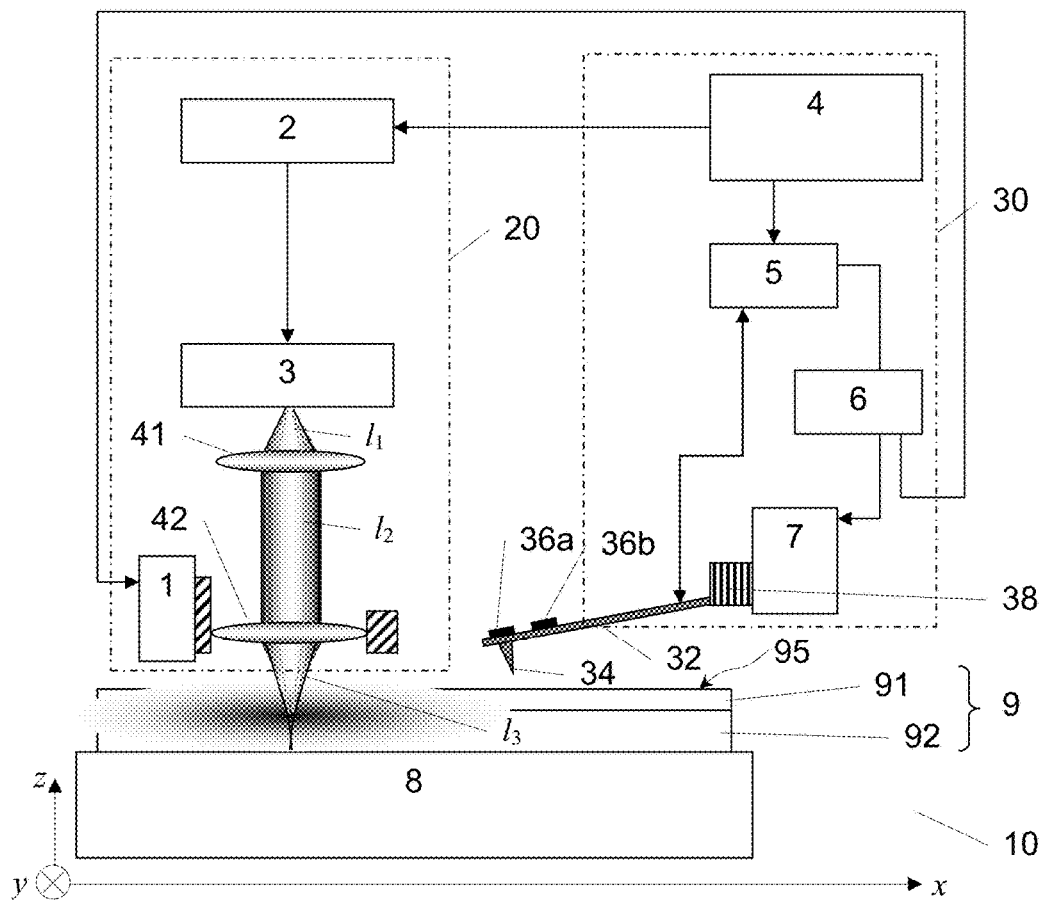
FIG. 1 schematically illustrates a dual apparatus for multiscale patterning, this apparatus having both thermo-optical lithography capability and thermal scanning probe lithography capability, according to embodiments of the invention.

In FIGS. 2-3, closing the switch 51 results in applying a voltage $V_h$ and thereby heating the tip 34 (FIG. 3), while closing the switch S3 (FIG. 2) results in applying a voltage $V_r$, which allows monitoring the distance between the tip 34 and the sample surface 95, e.g., via means 38 (see FIG. 1). For completeness, closing the switch S2 results in applying a voltage bias $V_f$ between the probe and the sample 9, which results in urging the probe towards the surface 95. Switches S1 and S2 are closed concomitantly to apply a temperature pulse while applying the probe tip to the surface, to write a small pattern 300.

In other words, the voltages $V_h$ and $V_f$ control the tip temperature and the electrostatic force, respectively, while the voltage $V_r$ relates to the probe-sample distance. If no voltage $V_f$ is applied (FIG. 2), the tip rests above the surface (typically 300 nm above the latter). A pixel is typically written by simultaneously applying a force and temperature pulse for several microseconds. The force pulse pulls the tip into contact while the heat pulse heats the tip and triggers the thermal decomposition of the resist.

More details as to the tOL and tSPL means are given in the next section.

Referring now more particularly to FIGS. 4-8, present methods can, in embodiments, further include one or more steps of imaging S29 previously obtained patterns. In particular, it can include a step of imaging at least part of the first pattern 200, in order to obtain location information xi about the probe tip location with respect to the first pattern 200. In that case, a tSPL step S30 can be performed after a first tOL step S20, taking into account the obtained location information xi. This notably allows for accurately position the second pattern 300 relatively to the first pattern 200, as illustrated in FIG. 9. Such an imaging step S29 is particularly useful when the patterns 200, 300 need be connected, like in FIG. 9.

Figure 6:
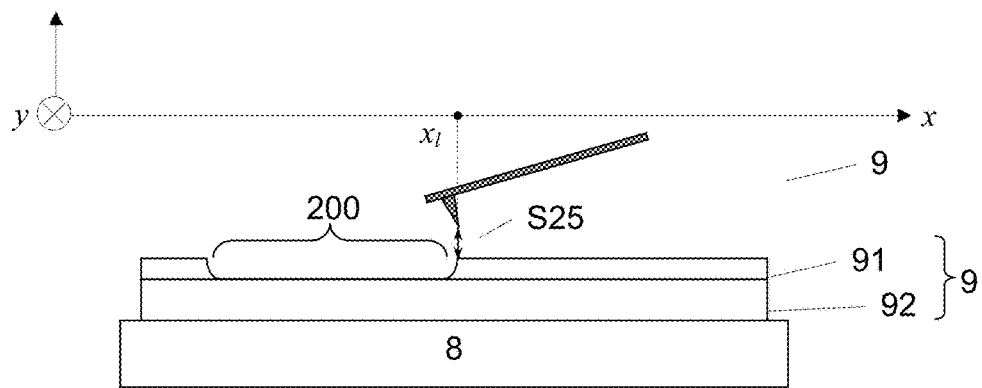
Figure 7:
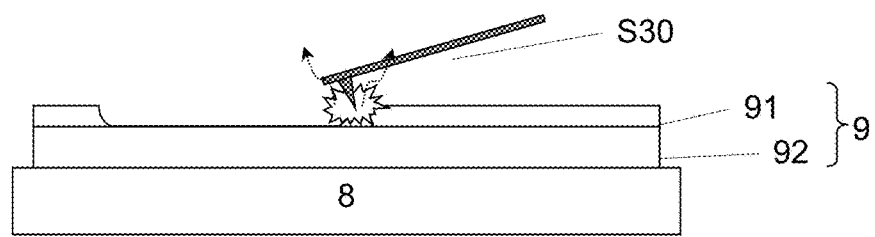
Figure 8:
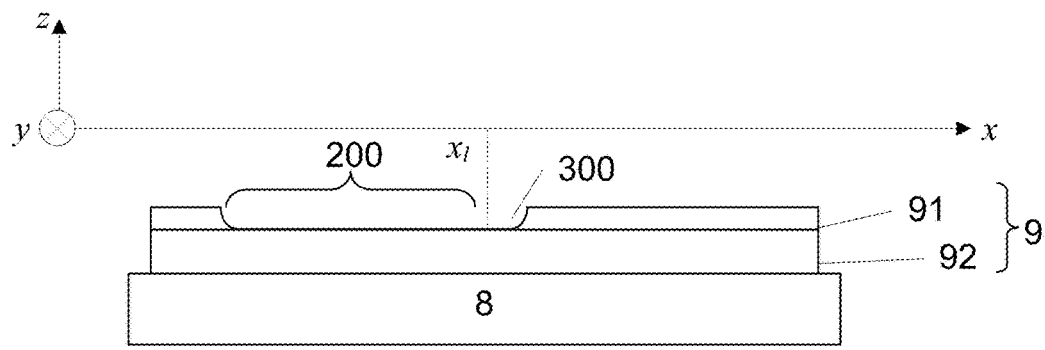

As further illustrated in FIG. 6, the step of imaging S25 is preferably performed via the probe tip 34, e.g., by measuring the varying resistance and thereby determining the surface shape. Other SPL techniques for imaging the surface 95 via a probe tip 34 are known, which can be used in the present context, thus avoiding the use of separate imaging means.

The present methods can typically include additional patterning steps S20, S30 (i.e., at least one additional tOL step S20 or at least one additional tSPL step S30) to create additional patterns 400. Various strategies can be contemplated to optimize the writing of the corresponding patterns 200, 300. In particular, such strategies can imply concurrent (i.e., partially concomitant) writing of the patterns. These additional steps can furthermore be performed according to location information xi acquired during a previous imaging step 29. Many additional patterning steps can accordingly be involved, as necessary to obtain the desired patterns. Any subsequent patterning step (be it a tSPL step or a tOL step)

can use location information obtained from imaging any previously obtained pattern. For completeness, note that a step 29 of imaging can be performed between two patterning steps or be partly concomitant with a first S20 and/or a second S30 patterning step, for time efficiency reasons. In particular, an imaging step S29 can be performed during a "second" patterning step, e.g., relying on the varying resistance of the heating means 36b.

It is understood that information obtained from an imaging step is correlated with the known positions (or vertical/horizontal offsets between the known positions) of the probe 32 and the tOL means 1, 42, for refining the position of the tOL and/or tSPL means, while creating the respective patterns.

Now, as useful as an imaging step S29 can be, such a step is not mandatory as, in variants, one can rely on the sole (known) geometric offset between the arrangement of the tOL means 20 and the arrangement of the tSPL means 30, e.g., to achieve registry or to adjust parameters of the tOL, especially when willing to connect the patterns 200 and 300. In that case, the small pattern 300 is typically engraved first. Then, the tOL means 20 are translated (vertically and/or horizontally) relatively to the sample by a distance that depends both on the last known position of the probe tip and the default shift or offset between the tOL means 20 and the tSPL means 30. Next, tOL means 20 are activated to create the large pattern 200, at the desired location. To that aim, the tSPL means 30 are preferably rigidly coupled to the tOL means 20 in a direction parallel to the surface of the sample placed in the apparatus, i.e., a direction parallel to the plane (x, y) in FIG. 1. This enables and integral translation of both tOL and tSPL means 20, 30 parallel to the surface 95 of the sample to be patterned, which is perhaps the simplest way to achieve in-plane registry of the two patterning means 20, 30. However, performing imaging steps S29 was shown to improve, in practice, the accuracy in the positioning of the patterns.

Figure 4:
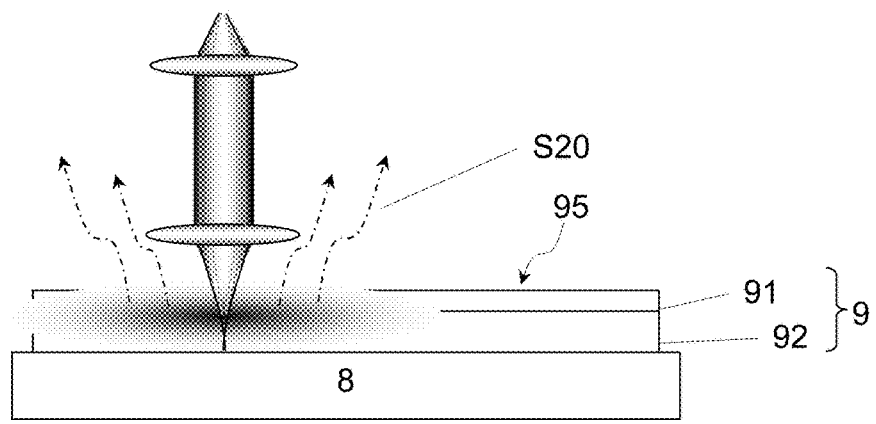
FIGS. 4-8 schematically illustrate steps of a method according to embodiments. More specifically.
Figure 5:
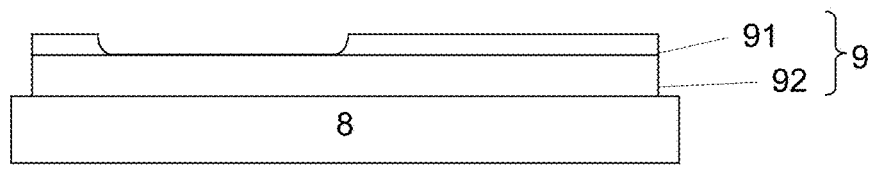

Referring now more particularly to FIG. 1 or 4, in preferred embodiments, the sample 9 used includes both an absorber layer 92 and an opto-thermal resist layer 91, the layer 91 being the layer to be primarily patterned. The absorber layer 92 is placed below the opto-thermal resist layer 91. Thanks to this layered structure, the light focused during a tOL step S20 heats the opto-thermal resist layer 91 both directly and indirectly. Indirect heating is due to absorption of light in the absorber layer 92, as illustrated in FIG. 1 or 4. Using a layered structure as described above helps the thermal decomposition of the opto-thermal resist layer 91, especially if the latter is too thin with respect to the absorption length of the light therein. Note that "light" is, in this description, assumed to be any electromagnetic radiation suitable for obtaining patterns 200, 400 as herein described.

In this respect, the thickness of the opto-thermal resist layer 91 can likely be less than or equal to the average absorption length of the light $l_1$ emitted from the light source. For instance, the absorber layer 92 can include an antireflective layer coating, thermally stable at the temperature of decomposition of the opto-thermal resist layer, to absorb the light power and thereby provide the temperature in the opto-thermal resist required for the writing process by decomposition. Typically, the thickness of the antireflective layer coating shall be between 50 and 200 nm. In addition (and possibly independently from the specification of the absorber layer 92), the thickness of the opto-thermal resist layer is typically less than 100 nm (and more preferably less than 50 nm). For example, the so-called AZ® BARLi®-II AZ Electronic Materials can be contemplated for the anti reflective coating, see http://www.microchemicals.com/products/photoresists/antireflective_coating/azr_barli_i-i.html.

The opto-thermal resist layer 91 can notably involve a network of molecules cross-linked via intermolecular, non essentially covalent bonds. Such materials have been proved to be suitable for thermal decomposition processes. Preferably, an average molecular mass of molecules in the first polymer film provided is between 100 Da and 2000 Da, more preferably in the range from 150 Da to 1000 Da (to enable direct evaporation of the molecules), and said molecules are preferably cross-linked via hydrogen bonds (e.g., phenolic molecular glasses).

However, it is still more advantageous to use a polymer material having polymer chains able to unzip upon thermal stimulation. The latter can notably be a poly(phthalaldehyde) film that has a glass transition temperature of 125° C.±20° C. and a thermal decomposition temperature of 150° C.±30° C., which materials lead to a clean decomposition process without residues and therefore high fidelity patterns.

In embodiments, the sample 9 used can include a polymer that includes a dispersion of particles 93 embedded therein, which particles are chosen such as to extend the optical absorption of the polymer to longer wavelengths (longer than those essentially absorbed by the polymer matrix). Suitable particles are notably: dye molecules such as molecules of coumarin; and/or quantum dots.

Each of the above exemplary materials can be used with or without an absorber layer.

Referring back to FIG. 1, another aspect of the invention is now described, which concerns the apparatus 10 itself. This apparatus 10 is adapted for implementing the steps of methods described above. In particular, this apparatus is designed for patterning patterns 200, 300 of substantially different critical dimensions, as discussed earlier. To that aim, it notably includes:

A sample holder 8, allowing for receiving the sample 9 to be patterned; and

Patterning means 20, 30. As discussed earlier, such means include both tOL 20 and tSPL means 30.

The tOL means 20 and the tSPL are controllably positionable relatively to the sample 9, in operation, as described above. Means 20 further include a light source 2 (e.g., a laser) and are designed to direct light $l_3$ onto the sample 9, in operation.

The tSPL means 30 include a probe tip 34 and can further include heating means 36a, and 36b as described above. The apparatus is furthermore configured to bring the probe tip 34 and the sample 9 in contact, as e.g., illustrated in FIGS. 2-3. In variants, the translation stage 8 can urge the sample 9 against a probe.

As already evoked earlier, the tSPL means 30 can be rigidly coupled to the tOL means 20 in the plane (x, y), to enable an "integral" translation of said means 20, 30 parallel to the surface 95 of the sample 9 to be patterned. This makes it possible to simply achieve in-plane registry of the two patterning means 20, 30. To that aim, the apparatus 10 can furthermore include an in-plane translation stage 8, suitably arranged in the apparatus to allow the sample holder 8 to translate parallel to said surface 95.

In embodiments, the tSPL means 30 further include probe tip control means 5, 6, 7, 38. Also, the tOL means 20 further include means 1, 3 for adjusting and/or modulating light $l_1$, $l_2$, $l_3$. The means 1, 3 can be connected to the probe tip control means 5, 6, 7, 38 for adjusting and/or modulating light $l_1$, $l_2$, $l_3$ according to a signal acquired by the probe tip control means 5, 6, 7, 38 via the probe tip 34. Preferably, the means 1, 3 are configured for adjusting light $l_3$ directed, e.g., focused, onto the sample 9.

The probe tip control means 5, 6, 7, 38 can further include an electrical resistance measurement unit 38 adapted for measuring the electrical resistance of the heating means 36b. The probe tip control means 5, 6, 7, 38 is preferably configured to determine a first distance between the probe tip 34 and the sample 9 according to the electrical resistance (as measured by unit 38, in operation). The means 1, 3 can notably include actuation means 1 connected to the probe tip control means 5, 6, 7, 38 for adjusting a second distance between the light focusing means 1, 42 and the sample 9, based on the electrical resistance measured by unit 38, in operation. In addition another heater element 36a can be arranged proximal to the tip, as described earlier in reference to FIGS. 2-3.

As illustrated in FIG. 1, and as a detailed example of how to achieve vertical registry of the tSPL means and tOL means, the probe tip control means 5, 6, 7, 38 can further include:

A distance controller 5, which is connected to the electrical resistance measurement unit 38 to process information about said first distance;

A feedback controller 6 connected to the distance controller 5 to be fed with such information about said first distance. The actuation means 1 can be connected to the feedback controller 6 to adjust said second distance according to said first distance; and A perpendicular translation stage 7 connected to the feedback controller 6, to control said first distance.

The tSPL means 30 can further include a pattern generator 4, to which the probe tip control means 5, 6, 7, 38 are connected. In that case, the means 1, 3 can notably include a light source modulator 3 connected to the pattern generator 4 to obtain pattern information therefrom and accordingly modulate the light $l_1$ emitted from the light source 2. In addition, the in-plane translation stage 8 can be connected to the pattern generator 4, in order to allow the sample holder 8 to translate parallel to the sample surface according to pattern information received from the pattern generator 4.

Use is made of tSPL to obtain small patterns: a pointed tip that is electrically heated and acts as heat source. High resolution patterning can be achieved by using sharp probe tips with an apex radius of typically 5 nm, yielding single pixel structures with a width of typically 20 nm. Likewise, a highly focused optical beam is used to serve a similar purpose, subject to the pattern size. The feature size is in that case limited by the focal spot. The latter is typically 300 nm when using blue light and it can be less than 200 nm if UV light is used.

As evoked earlier, aspects of the tOL and tSPL means can be jointly designed. In particular, present methods and apparatuses can include any one or any combination of the following:

The same sample holder, housing or in-plane translation stage 8 can be used for both tOL and tSPL steps;

The tOL and tSPL means 20, 30 are rigidly coupled, e.g., in a direction parallel to the sample surface, or in the plane (x, y), to enable integral translation relatively to the sample and achieve (horizontal/vertical) registry of the two means 20, 30. Yet, the two means can decouple in the vertical direction;

The tOL and tSPL means 20, 30 can use common controls 4, 5, 6, 7, 38 (independently or in combination) or information obtained from such controls, as illustrated in FIG. 1, in particular for refining the tOL location.

More details as to possible embodiments of the apparatuses 10 are given in the next section.

Combining optical and probe lithography in one and the same lithographic platform has several important benefits:

Large scale patterning capabilities are enabled, by using optical beams;

Meanwhile, nanometer scale patterning capabilities are available, using probes. The tSPL steps described herein are for instance compatible with standard CMOS fabrication technology. For instance, 27 nm half-pitch patterns can be fabricated in Si with excellent line-edge uniformity (2.7 nm 3 sigma LER). Such patterning capabilities fulfill today's requirements for mask-less lithography for example for the fabrication of EUV-masks (where EUV stands for extreme ultraviolet, e.g., having 12.5 nm wavelength.

In-situ process control is enabled by probe imaging, in embodiments. Perfect match of the resolution capabilities of the tOL and tSPL steps is made possible, for seamless multiscale patterning;

Highly accurate stitching and overlay capabilities are possible, owing notably to the use of probes; and Fast turn-around processing is made possible thanks to the combined capabilities, by avoiding the need for distinct platforms for probe and optical lithographic steps.

The above embodiments have been succinctly described in reference to the accompanying drawings and can accommodate a number of variants. Several combinations of the above features can be contemplated. Examples are given in the next section.

2. Specific Embodiments, Technical Implementation Details and Examples

First, specific aspects of tOL means 20 (e.g., involved in embodiments such as depicted in FIG. 1) are discussed. The tOL means can typically include a light source 2, a shutter mechanism 3, lenses 41, 42, and vertical translation means 1. In addition, a translation device 8 can be provided to move the sample 9 (e.g., including an opto-thermal resist) relatively to the optical beam $l_3$. The stage 8 is preferably an in-plane translation stage, but it can also enable vertical movement, as touched earlier. The light source 2 emits preferentially in the blue to UV spectral range. A preferred light source is a laser diode capable of emitting 10-100 mW of power. The shutter mechanism 3 can be any device or method, which allows modulating the light intensity impinging on the sample 9. Control of the shutter mechanism can be ensured by a pattern generator 4 (it can also be made dependent on an imaging signal, e.g., acquired via the probe tip). The lens 42 focuses the light beam to a narrow focal spot at the level of the sample. The spot size depends on the numerical aperture (NA) of the lens. Preferred values for NA are in the range from 0.2 to 1.4, yielding a spot diameter that is approximately in the range from $1.6 \times \lambda$ to $0.3 \times \lambda$, respectively, where $\lambda$ denotes an average wavelength of the light. To write a pixel, the shutter can be opened for a short time, e.g., on the order of microseconds to milliseconds, thereby irradiating the sample 9. The light is converted into heat in the sample, which in turn is used to thermally decompose the resist into volatile low molecular weight fragments, e.g., using materials such as described in the previous section. The hot fragments form a vapor phase and emanate via diffusion from the substrate. As a result, a void is created similar to the writing of a pixel using a hot tip as heat source. By controlling the exposure time, the depth of the written structure can be adjusted.

Preferred opto-thermal resists have been described in the previous section. Materials are preferably chosen such as to convert into a vapor phase at a relatively low temperature, typically in the range from 150° C. to 250° C., and which are in an amorphous glassy state at room temperature.

It can be realized that networks of molecules cross-linked via intermolecular, non essentially covalent bonds (e.g., phenolic molecular glasses) and poly(phthalaldehyde) possess the required properties.

Different strategies for achieving the desired opto-thermal functionality are now discussed in reference to poly(phthaladehyde) resists (or "PPA" for short), for the sake of illustration.

A first way is to use direct conversion in PPA via optical absorption. The transmission spectrum of a 100 micrometer thick film of PPA on a quartz glass support was for instance investigated. Short wave-length radiation with $\lambda<300$ nm was seen to be efficiently absorbed and thus converted to heat directly in the PPA resist. The heat generated in the polymer is proportional to the light intensity which decays exponentially from the surface into the bulk over a distance given by the absorption length. The latter is typically on the order of 50 nm to 100 nm in PPA films. Direct conversion is ideal for the patterning of thick films and for the writing of 3D relief structures because the positive temperature gradient towards the surface assists the efficient evaporation of the PPA material. The optical absorption of the PPA layer can be extended to the long-wavelength regime by blending the polymer with strong dye molecules. For example, coumarin molecules efficiently absorb 450 nm radiation with an absorption length of ~100 nm/mol. Alternatively, quantum dots exhibiting similarly efficient absorption properties can be used.

Direct heating becomes less efficient as the film thickness decreases, in particular in PPA films having a thickness that is less than the absorption length. This additional problem can be solved by the use of a substrate layer which strongly absorbs the incident light. As it can be realized, the so-called bottom anti-reflection coating (BARC) materials are well suited for this purpose. For instance, the transmission spectrum of a 100 nm thick absorber layer of BARLi II (AZ-Electronics Materials) was investigated. The absorber layer results to converts approximately 50% of the light energy into heat at a wavelength of 400 nm. The heat generated in the absorber is transferred into the PPA via thermal diffusion. As a result, the temperature gradient in the PPA layer is inverted, the surface being colder than the surface in contact with the absorber. Structures with (steep) sidewalls can accordingly be created in the PPA, which can advantageously be used for writing binary lithographic patterns with good line edge roughness (see supplemental information below).

In particular, the following experiment was performed, using an indirect heating method as described above. The sample used includes a Si wafer with a 100 nm thick layer of BARLi II as optical absorber and a 20 nm PPA top-layer for thermal patterning, similar to the depiction in FIG. 1. A 405 nm blue laser diode is used as a light source. The light beam is expanded and collimated by means of lenses and sent via a 50% beam splitter to a focusing objective (100×, NA 0.7). An optical image of the sample is observed by means of a CCD Camera using an auxiliary white light illumination. The reflected laser beam is blocked from entering the camera by means of a dielectric blocking filter in the light path to the camera. The laser power, approximately 2 mW at the focal point, can be electronically turned on or off to enable/disable optical writing. To write a pattern, the sample is laterally moved in the plane orthogonal to the laser beam using a piezo-electric translation stage. The linear scan speed in the experiment was 100 micrometer/s.

An optical micrograph of 200×200 micrometer area of the sample was obtained, after patterning of single pixel wide line segments. A topographic analysis of the pattern by means of atomic force microscopy (AFM) reveals that the PPA was successfully removed at the focal spot and more importantly, that the steep line-edge profiles are obtained at the interface to the optical absorber layer. The line width of the written structures at the interface is 350 nm. One also sees that the heat created at the laser spot was even sufficient to partially decompose the absorber layer.

Other aspects of the apparatus 10 of FIG. 1 are now discussed in detail. The laser light from source 2 is focused onto the sample via a telescopic lens system 1, 41, 42. The primary focusing lens 42 is mounted on an actuator 1 which allows precise alignment of the focal spot onto the sample surface 95. The output power of the laser light source is modulated by a controller 3 which gets information from the pattern generator 4. The pattern generator also provides control signals for the x and y position of the sample 9, which is mounted on a corresponding translation stage 8. A scanning probe lithography system 30 is mechanically coupled to the laser scanning system 20. The vertical position of the cantilever probe 32 is adjusted by a translation stage 7. The cantilever probe provides means for sensing the vertical position (here termed height) of the probe with respect to the sample and for heating the tip for writing lithographic patterns, as discussed in the previous section. A typical embodiment of the cantilever probe is shown in FIGS. 2-3. For height sensing, a Si heater element 36*b* integrated into the right arm of the U-structure of the probe is activated. The electrical resistance of the heater element 36*b* changes with the distance above the sample, providing a means to measure the height with nanometer precision. This can be done not only in contact with the sample but also from a distance of up to several microns. The height information is processed in a controller 5 and fed into a feedback controller 6 (FIG. 1). The feedback controller adjusts the height of the probe cantilever and at the same time the focus position of the laser beam. Thereby, perfect registry of the vertical position of the probe and the laser can be maintained at all times. The controller 5 also provides the heater 36*a* signals and capacitive pulses for writing lithographic patterns provided by the pattern generator 4 for thermal probe writing.

As explained above, registry of the vertical dimension can be achieved using direct feedback methods. Now, the registry in the in-plane dimensions can be optimally achieved via topographic imaging using the thermal probe as AFM sensor. Alternatively, the thermal sensor can be used from a distance of several microns to detect lateral modulation in the surface topography, to ensure mix and match of the patterns. In addition, not only structures written by the laser can be imaged but also topographic structures buried underneath the thermal resist stack. This allows for precise overlay capability of the laser written structures.

For example, assume that a high resolution line pattern 300 needs be connected to bonding pads 200 and 400 as shown in FIG. 9. Then, in a first step, the bonding pad 200 is written using tOL, step S20 in FIG. 11. After writing, the pattern is imaged using the thermal probe, step S29. Thereby, the exact position of the pattern relative to the probe can be determined with nanometer precision. In a second step S30, a high resolution pattern 300 is written. In a further step S20, a bonding pad 400 is written optically using positioning information as obtained from a previous imaging step S29, for matching the patterns. The bonding pads can typically have a characteristic diameter of 100 micrometers. Such dimensions, however, remain much larger than the critical dimension of tOL of 200-500 nm, while the width of the line pattern 300 is larger or equal to 10 nm (the critical dimension of tSPL), in this example (obviously not to scale).

Finally, supplemental information is now provided as to hard-mask transfer of shallow patterns into high aspect ratio dual tone patterns in a thick resist. The patterns created by thermal lithography cannot be directly used for conventional Si processing due to the shallow depth and the sloped side-walls. This problem can be overcome using a hard-mask approach. Present inventors were able to demonstrate that high resolution patterns with 27 nm half-pitch in Si and less than 2.7 nm (3 sigma) line edge roughness can be fabricated starting from 20 nm thick PPA films (same film thickness as used in one of the above test). These performance figures are in line with today's requirements for maskless lithography, for example for the fabrication of EUV masks.

According to a first aspect, the present invention is embodied as a method for multiscale patterning of a sample, the method including: placing the sample in an apparatus having both thermo-optical lithography capability and thermal scanning probe lithography capability; and patterning two patterns onto the sample, respectively by: thermo-optical lithography, wherein light is emitted from a light source onto the sample to heat the latter and thereby write a first pattern that is the largest of the two patterns; and thermal scanning probe lithography, wherein the sample and a heated probe tip are brought in contact for writing a second pattern that has substantially smaller critical dimensions than the first pattern.

In embodiments, patterning by thermo-optical lithography includes adjusting and/or modulating the light according to a signal acquired via the probe tip, wherein said signal is preferably acquired by measuring an electrical resistance of heating means arranged at a probe that includes said probe tip, such that said electrical resistance depends on a distance between the probe tip and the sample.

Preferably, a probe that includes said probe tip is heated via a heater element arranged at the probe; and said signal is acquired by measuring an electrical resistance of the heating means, which electrical resistance depends on a first distance between the probe tip and the sample, and adjusting and/or modulating the light includes adjusting a second distance between light focusing means and the sample based on the measured electrical resistance or the first distance, the light focusing means being adapted to focus the emitted light onto the sample.

In preferred embodiments, the thermal scanning probe lithography step is performed after the thermo-optical lithography step; and the method further includes a step of imaging at least part of the first pattern, to obtain location information about the probe tip location with respect to the first pattern; and the step of thermal scanning probe lithography is performed according to said location information, to position the second pattern relatively to the first pattern, and the method preferably includes an additional thermo-optical lithography step or an additional thermal scanning probe lithography step to create an additional pattern, the additional step more preferably performed according to said location information.

Preferably, imaging at least part of the first pattern is performed via the probe tip.

In embodiments, the sample placed includes both an absorber layer and an opto-thermal resist layer, which is to be patterned, the absorber layer placed below the opto-thermal resist layer, such that during an thermo-optical lithography step, the focused light heats the opto-thermal resist layer directly and indirectly due to absorption of light in the absorber layer.

Preferably, the absorber layer includes an antireflective layer coating, thermally stable at the temperature of decomposition of the opto-thermal resist layer and, preferably, the thickness of the antireflective layer coating is between 50 and 200 nm; and the thickness of the opto-thermal resist layer is less than 100 nm, more preferably less than 50 nm.

In preferred embodiments, the thickness of the opto-thermal resist layer is less than or equal to an average absorption length of the light emitted from the light source.

Preferably, the sample includes an opto-thermal resist layer including one of: a network of molecules cross-linked via intermolecular, non-essentially covalent bonds; and a polymer material having polymer chains able to unzip upon thermal stimulation, the latter preferably being a poly(phthalaldehyde) film that has a glass transition temperature of 125° C.±20° C. and a thermal decomposition temperature of 150° C.±30° C.

In embodiments, the sample includes a polymer with a dispersion of particles embedded therein, which particles extends the optical absorption of the polymer to longer wavelengths, said particles preferably including: dye molecules such as molecules of coumarin; and/or quantum dots.

According to another aspect, the invention is embodied as an apparatus adapted for implementing the steps of the method according to any one of the above embodiments, the apparatus including: a sample holder, for placing a sample to be patterned; patterning means, including: optical beam lithography means controllably positionable relatively to the sample, in operation, and including a light source such as a laser, the optical beam lithography means being furthermore configured to direct light onto the sample, in operation; and thermal scanning probe lithography means, including: a probe tip, the apparatus being further configured to bring the sample and the probe tip in contact, in operation; and, preferably, a heater element coupled in the apparatus to controllably heat the probe tip, in operation, whereby the apparatus is adapted for patterning two patterns of substantially different critical dimensions onto the sample, respectively via the thermo-optical lithography means and thermal scanning probe lithography means.

In preferred embodiments, the thermal scanning probe lithography means further include probe tip control means and the optical beam lithography means further include means for adjusting and/or modulating light, the means for adjusting and/or modulating light connected to the probe tip control means for adjusting and/or modulating light according to a signal acquired by the probe tip control means via the probe tip, and preferably for adjusting light directed onto the sample.

Preferably, the apparatus further includes a probe that includes said probe tip and heating means arranged at the probe, and wherein the probe tip control means further includes an electrical resistance measurement unit adapted for measuring an electrical resistance of the heating means, the probe tip control means being preferably configured to determine a first distance between the probe tip and the sample according to an electrical resistance as measurable by the electrical resistance measurement unit, in operation, and the means for adjusting and/or modulating light includes actuation means connected to the probe tip control means for adjusting a second distance between light focusing means and the sample, based on an electrical resistance as measurable by the electrical resistance measurement unit, in operation.

In embodiments, the probe tip control means are configured to determine said first distance between the probe tip and the sample according to said electrical resistance as measurable by the electrical resistance measurement unit, in operation, and the probe tip control means further include: a distance controller connected to the electrical resistance measurement unit to process information about said first distance; a feedback controller connected to the distance controller to be fed with such information about said first distance; and a perpendicular translation stage connected to the feedback controller, to control said first distance, wherein the actuation means are connected to the feedback controller to adjust said second distance correlatively with said first distance.

Preferably: the thermal scanning probe lithography means further includes a pattern generator, to which the probe tip control means are connected; and the means for adjusting and/or modulating light include a light source modulator connected to the pattern generator to obtain pattern information therefrom and accordingly modulate light emitted from the light source.

Apparatuses and methods embodying the present invention will now be described, by way of non-limiting examples, and in reference to the accompanying drawings. Technical features depicted in the drawings are not necessarily to scale.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. This is especially true for any of those features described in reference to methods, which can be present in corresponding apparatuses and therefore can be combined with any feature of these apparatuses, and conversely. More generally, any feature described in the present description (but not explicitly claimed) can be considered to be implicitly part of in any of the appended claims, and possibly independently from the context wherein this feature is actually described, provided that it makes technically sense in the context of that claim. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, present methods can involve a pattern generator, and present apparatuses can be understood as including the sample to be patterned, e.g., the latter including an absorber layer.

The invention claimed is:

1. A method for multiscale patterning of a sample, the method comprising:
   placing the sample in an apparatus having both thermo-optical lithography capability and thermal scanning probe lithography capability; and
   patterning two patterns onto the sample, respectively by:
      thermo-optical lithography, wherein light is emitted from a light source onto the sample to heat the latter and thereby write a first pattern that is the largest of the two patterns; and
      thermal scanning probe lithography, wherein the sample and a heated probe tip are brought in contact for writing a second pattern that has substantially smaller critical dimensions than the first pattern.

2. The method according to claim 1, wherein the patterning by thermo-optical lithography comprises adjusting and/or modulating the light according to a signal acquired via the probe tip.

3. The method according to claim 2, wherein:
   a probe that comprises said probe tip is heated via a heater element arranged at the probe; and
   said signal is acquired by measuring an electrical resistance of the heating means, wherein the electrical resistance depends on a first distance between the probe tip and the sample, and
   wherein adjusting and/or modulating the light comprises adjusting a second distance between light focusing means and the sample based on the measured electrical resistance or the first distance, the light focusing means being adapted to focus the emitted light onto the sample.

4. The method according to claim 2, wherein said signal is acquired by measuring an electrical resistance of heating means arranged at a probe that comprises said probe tip, such that said electrical resistance depends on a distance between the probe tip and the sample.

5. The method according to claim 1, wherein:
   the thermal scanning probe lithography step is performed after the thermo-optical lithography step; and
   the method further comprises a step of imaging at least part of the first pattern, to obtain location information about the probe tip location with respect to the first pattern; and
   the step of thermal scanning probe lithography is performed according to said location information, to position the second pattern relatively to the first pattern.

6. The method according to claim 5, wherein the imaging at least part of the first pattern is performed via the probe tip.

7. The method according to claim 5, wherein the method further comprises an additional thermo-optical lithography step or an additional thermal scanning probe lithography step to create an additional pattern.

8. The method according to claim 7, wherein the additional step is performed according to said location information.

9. The method according to claim 1, wherein the sample placed comprises both an absorber layer and an opto-thermal resist layer, which is to be patterned, the absorber layer placed below the opto-thermal resist layer, such that during an thermo-optical lithography step, the focused light heats the opto-thermal resist layer directly and indirectly due to absorption of light in the absorber layers.

10. The method according to claim 9, wherein the absorber layer comprises an antireflective layer coating, thermally stable at the temperature of decomposition of the opto-thermal resist layer.

11. The method according to claim 10, wherein the thickness of the antireflective layer coating is between 50 and 200 nm.

12. The method according to claim 10, wherein the thickness of the opto-thermal resist layer is less than 100 nm.

13. The method according to claim 10, wherein the thickness of the opto-thermal resist layer is less than 50 nm.

14. The method according to claim 9, wherein the thickness of the opto-thermal resist layer is less than or equal to an average absorption length of the light emitted from the light source.

15. The method according to claim 1, wherein the sample comprises an opto-thermal resist layer comprising one of: a network of molecules cross-linked via intermolecular, non essentially covalent bonds; and a polymer material having polymer chains able to unzip upon thermal stimulation.

16. The method according to claim 15, wherein the polymer material is a poly(phthalaldehyde) film that has a glass transition temperature of 125° C.+/−20° C. and a thermal decomposition temperature of 150° C.+/−30° C.

17. The method according to claim 1, wherein the sample comprises a polymer with a dispersion of particles embedded therein, wherein the particles extend the optical absorption of the polymer to longer wavelengths.

18. The method according to claim 17, wherein said particles comprises: dye molecules of coumarin and/or quantum dots.

19. An apparatus having both thermo-optical lithography capability and thermal scanning probe lithography capability configured to implement a method for multiscale patterning of a sample, the apparatus comprising: a sample, a sample holder, for placing the sample to be patterned in the present apparatus; patterning means for patterning two patterns onto the sample, comprising: optical beam lithography means controllably positionable relatively to the sample, in operation, and including a light source (2), the optical beam lithography means being furthermore configured to direct light onto the sample, in operation, wherein light emitted from the light source onto the sample heats the latter and thereby write a first pattern that is the largest of the two patterns; and thermal scanning probe lithography means including: a probe tip, the apparatus being further configured to bring the sample and the probe tip in contact, in operation, for writing a second pattern that has substantially smaller critical dimensions than the first pattern.

20. The apparatus according to claim 19, wherein the thermal scanning probe lithography means further comprise probe tip control means and the optical beam lithography means further comprise means for adjusting and/or modulating light, the means for adjusting and/or modulating light connected to the probe tip control means for adjusting and/or modulating light according to a signal acquired by the probe tip control means via the probe tip, and preferably for adjusting light directed onto the sample.

21. The apparatus according to claim 20, further comprising a probe that comprises said probe tip and heating means arranged at the probe, and wherein: the probe tip control means further comprises an electrical resistance measurement unit adapted for measuring an electrical resistance of the heating means, the probe tip control means being preferably configured to determine a first distance between the probe tip and the sample according to an electrical resistance as measurable by the electrical resistance measurement unit, in operation, and the means for adjusting and/or modulating light comprises actuation means connected to the probe tip control means for adjusting a second distance between light focusing means and the sample, based on an electrical resistance as measurable by the electrical resistance measurement unit, in operation.

22. The apparatus according to claim 21, wherein the probe tip control means are configured to determine said first distance between the probe tip and the sample according to said electrical resistance as measurable by the electrical resistance measurement unit, in operation, and the probe tip control means further comprise: a distance controller connected to the electrical resistance measurement unit to process information about said first distance; a feedback controller connected to the distance controller to be fed with such information about said first distance; and a perpendicular translation stage connected to the feedback controller, to control said first distance, wherein the actuation means are connected to the feedback controller to adjust said second distance correlatively with said first distance.

23. The apparatus according to claim 21, wherein: the thermal scanning probe lithography means further comprises a pattern generator, to which the probe tip control means are connected; and the means for adjusting and/or modulating light comprise a light source modulator connected to the pattern generator to obtain pattern information therefrom and accordingly modulate light emitted from the light source.

24. The apparatus according to claim 19, wherein a heater element is coupled in the apparatus to controllably heat the probe tip, in operation.

25. The apparatus according to claim 19, wherein the light source is a laser.

* * * * *